(12) United States Patent
Jeong et al.

(10) Patent No.: US 10,084,116 B2
(45) Date of Patent: **\*Sep. 25, 2018**

(54) LIGHT EMITTING DEVICE AND LIGHT EMITTING DEVICE PACKAGE

(71) Applicant: LG INNOTEK CO., LTD., Seoul (KR)

(72) Inventors: Hwan Hee Jeong, Seoul (KR); Sang Youl Lee, Seoul (KR); June O. Song, Seoul (KR); Ji Hyung Moon, Seoul (KR); Kwang Ki Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/804,021

(22) Filed: Nov. 6, 2017

(65) Prior Publication Data

US 2018/0062045 A1 Mar. 1, 2018

Related U.S. Application Data

(63) Continuation of application No. 15/402,491, filed on Jan. 10, 2017, now Pat. No. 9,837,581, which is a
(Continued)

(30) Foreign Application Priority Data

Mar. 15, 2010 (KR) .................. 10-2010-0022754

(51) Int. Cl.
*H01L 33/00* (2010.01)
*H01L 33/44* (2010.01)
(Continued)

(52) U.S. Cl.
CPC .............. *H01L 33/44* (2013.01); *H01L 33/06* (2013.01); *H01L 33/32* (2013.01); *H01L 33/36* (2013.01);
(Continued)

(58) Field of Classification Search
None
See application file for complete search history.

(56) References Cited

U.S. PATENT DOCUMENTS 5,952,681 A 9/1999 Chen
6,586,762 B2 7/2003 Kozaki
(Continued)

FOREIGN PATENT DOCUMENTS

CN 101188267 A 5/2008
JP 7-94782 4/1995
(Continued)

OTHER PUBLICATIONS

Korean Office Action dated Oct. 25, 2010 issued in Application No. 10-2010-0022754.
(Continued)

*Primary Examiner* — Bradley K Smith
(74) *Attorney, Agent, or Firm* — Ked & Associates LLP

(57) ABSTRACT

Disclosed are a light emitting device and a light emitting device package. The light emitting device includes a light emitting structure including a first conductive semiconductor layer, an active layer on the first conductive semiconductor layer, and a second conductive semiconductor layer on the active layer, an adhesive layer contacting a top surface of the first conductive semiconductor layer, a first electrode contacting a top surface of the first conductive semiconductor and a top surface of the adhesive layer, and a second electrode contacting the second conductive semiconductor layer, wherein the adhesive layer contacting the first electrode is spaced apart from the second electrode.

20 Claims, 23 Drawing Sheets

Related U.S. Application Data continuation of application No. 15/044,627, filed on Feb. 16, 2016, now Pat. No. 9,577,150, which is a continuation of application No. 14/717,464, filed on May 20, 2015, now Pat. No. 9,287,457, which is a continuation of application No. 14/457,384, filed on Aug. 12, 2014, now Pat. No. 9,076,930, which is a continuation of application No. 13/014,390, filed on Jan. 26, 2011, now Pat. No. 8,847,268.

(51) Int. Cl.

| | | |
|---|---|---|
| *H01L 33/36* | (2010.01) | |
| *H01L 33/42* | (2010.01) | |
| *H01L 33/40* | (2010.01) | |
| *H01L 33/06* | (2010.01) | |
| *H01L 33/38* | (2010.01) | |
| *H01L 33/32* | (2010.01) | |
| H01L 33/10 | (2010.01) | |
| H01L 33/22 | (2010.01) | |
| F21Y 105/10 | (2016.01) | |
| *F21K 9/23* | (2016.01) | |
| F21Y 115/10 | (2016.01) | |
| F21Y 113/13 | (2016.01) | |

(52) U.S. Cl.
CPC ............ *H01L 33/38* (2013.01); *H01L 33/387* (2013.01); *H01L 33/40* (2013.01); *H01L 33/42* (2013.01); *F21K 9/23* (2016.08); *F21Y 2105/10* (2016.08); *F21Y 2113/13* (2016.08); *F21Y 2115/10* (2016.08); *H01L 33/0079* (2013.01); *H01L 33/10* (2013.01); *H01L 33/22* (2013.01); *H01L 2224/48091* (2013.01); *H01L 2224/48247* (2013.01); *H01L 2224/48257* (2013.01); *H01L 2924/0002* (2013.01); *H01L 2924/12032* (2013.01)

(56) References Cited

U.S. PATENT DOCUMENTS

| | | | |
|---|---|---|---|
| 6,610,995 B2 | 8/2003 | Nakamura et al. | |
| 6,891,871 B1 | 5/2005 | Nomura et al. | |
| 6,998,690 B2 | 2/2006 | Nakamura et al. | |
| 7,700,960 B2* | 4/2010 | Kim | H01L 33/42 257/72 |
| 7,939,839 B2* | 5/2011 | Hasnain | H01L 27/153 257/93 |
| 8,217,407 B2 | 7/2012 | Watanabe et al. | |
| 8,373,193 B2 | 2/2013 | Kim et al. | |
| 8,658,441 B2 | 2/2014 | Bando et al. | |
| 8,847,268 B2* | 9/2014 | Choi | H01L 33/32 257/99 |
| 9,076,930 B2* | 7/2015 | Jeong | H01L 33/32 |
| 9,287,457 B2* | 3/2016 | Jeong | H01L 33/32 |
| 2002/0154496 A1 | 10/2002 | Chen et al. | |
| 2003/0136957 A1 | 7/2003 | Tsuda et al. | |
| 2004/0266044 A1 | 12/2004 | Park et al. | |
| 2005/0121679 A1 | 6/2005 | Nagahama et al. | |
| 2007/0131958 A1 | 6/2007 | Hsu et al. | |
| 2008/0128721 A1 | 6/2008 | Watanabe et al. | |
| 2008/0157121 A1 | 7/2008 | Ohki | |
| 2008/0173880 A1 | 7/2008 | Manabe et al. | |
| 2008/0185606 A1 | 8/2008 | Sano et al. | |
| 2009/0108250 A1 | 4/2009 | Kim et al. | |
| 2009/0127575 A1 | 5/2009 | Horng et al. | |
| 2009/0272994 A1 | 11/2009 | Lim | |
| 2009/0315058 A1 | 12/2009 | Lee et al. | |
| 2009/0321775 A1 | 12/2009 | Hasnain | |
| 2010/0059768 A1 | 3/2010 | Hasnain | |
| 2011/0024784 A1 | 2/2011 | Song | |
| 2011/0156086 A1 | 6/2011 | Kim et al. | |
| 2014/0091353 A1* | 4/2014 | Lee | H01C 7/006 257/99 |

FOREIGN PATENT DOCUMENTS

| | | |
|---|---|---|
| JP | H09-232632 A | 9/1997 |
| JP | 10-242516 | 9/1998 |
| JP | 10-242518 | 9/1998 |
| JP | H11-126947 A | 5/1999 |
| JP | 2001-160650 A | 6/2001 |
| JP | 2001-339121 A | 12/2001 |
| JP | 2002-111059 | 4/2002 |
| JP | 2006-237574 | 9/2006 |
| JP | 2007-096116 A | 4/2007 |
| JP | 04-172515 B2 | 10/2008 |
| JP | 2009-094107 A | 4/2009 |
| KR | 10-0609968 B1 | 7/2006 |
| KR | 10-0721515 B1 | 5/2007 |
| KR | 10-2008-0082101 A | 9/2008 |
| KR | 10-2008-0087251 A | 10/2008 |
| KR | 10-2009-0027329 A | 3/2009 |
| KR | 10-2009-0104453 | 10/2009 |
| TW | 200637034 | 10/2006 |
| TW | 200834984 A | 8/2008 |
| TW | 200945631 A | 11/2009 |
| WO | WO 2009/145502 A2 | 12/2009 |
| WO | WO 2009/154383 A2 | 12/2009 |

OTHER PUBLICATIONS

Chinese Office Action dated Jan. 24, 2013 issued in Application No. 201110040319.3.
U.S. Office Action dated Feb. 14, 2013 for U.S. Appl. No. 13/014,390.
Chinese Office Action dated Sep. 11, 2013 for Application 201110040319.3.
U.S. Office Action issued in U.S. Appl. No. 13/014,390 dated Dec. 11, 2013.
U.S. Office Action issued in U.S. Appl. No. 14/055,675 dated Dec. 12, 2013.
U.S. Office Action issued in U.S. Appl. No. 14/457,384 dated Oct. 24, 2014.
European Search Report dated Nov. 20, 2014, issued in Application No. 11153745.2 (English translation).
Japanese Office Action dated Dec. 2, 2014, issued in Application No. 2011-055810.
U.S. Notice of Allowance issued in U.S. Appl. No. 14/457,384 dated Feb. 20, 2015.
Japanese Office Action dated May 1, 2015.
U.S. Office Action issue in U.S. Appl. No. 15/044,627 dated May 5, 2016.
Taiwanese Office Action issued in Application No. 100100468 dated May 25, 2015.
Japanese Office Action dated Nov. 8, 2016 issued in Application No. 2015-178849.
Taiwan Office Action dated Apr. 13, 2017 (English Translation).
U.S. Office Action issue in U.S. Appl. No. 15/402,491 dated Jun. 15, 2017.

* cited by examiner

LIGHT EMITTING DEVICE AND LIGHT EMITTING DEVICE PACKAGE

CROSS-REFERENCE TO RELATED APPLICATION(S)

This application is a Continuation Application of prior U.S. patent application Ser. No. 15/402,491 filed on Jan. 10, 2017, which is a continuation of U.S. patent application Ser. No. 15/044,627 filed on Feb. 16, 2016, now U.S. Pat. No. 9,577,150, which is a continuation of U.S. patent application Ser. No. 14/717,464 filed May 20, 2015, now U.S. Pat. No. 9,287,457 which is a continuation of U.S. patent application Ser. No. 14/457,384 filed on Aug. 12, 2014, now U.S. Pat. No. 9,076,930, which is a continuation of U.S. patent application Ser. No. 13/014,390 filed on Jan. 26, 2011, now U.S. Pat. No. 8,847,268, which claims the benefit of Korean Patent Application No. 10-2010-0022754 filed in Korea on Mar. 15, 2010, which are hereby incorporated in their entirety by reference as if fully set forth herein.

BACKGROUND

The embodiment relates to a light emitting device and a light emitting device package.

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps, liquid crystal displays, electric signboards, and street lamps.

SUMMARY

The embodiment provides a light emitting device having a novel structure and a lighting emitting device package.

The embodiment provides a light emitting device capable of improving reliability and a light emitting device package.

According to the embodiment, a light emitting device includes a light emitting structure including a first conductive semiconductor layer, an active layer on the first conductive semiconductor layer, and a second conductive semiconductor layer on the active layer, an adhesive layer contacting a top surface of the first conductive semiconductor layer a first electrode contacting a top surface of the first conductive semiconductor and a top surface of the adhesive layer, and a second electrode contacting the second conductive semiconductor layer, wherein the adhesive layer contacting the first electrode is spaced apart from the second electrode.

According to the embodiment, a light emitting device includes a conductive support member, a light emitting structure including a first conductive semiconductor layer, an active layer, and a second conductive semiconductor layer on the conductive support member, an adhesive layer contacting a top surface of the light emitting structure, and an electrode contacting a top surface of the adhesive layer and a top surface of the light emitting structure.

According to the embodiment, the light emitting device package includes a body, a light emitting device on the body, and a molding member surrounding the light emitting device. The light emitting device includes a body, a light emitting device on the body, and a molding member surrounding the light emitting device, wherein the light emitting device includes a light emitting structure including a first conductive semiconductor layer, an active layer, and a second conductive semiconductor layer, an adhesive layer contacting a top surface of the first conductive semiconductor layer, a first electrode contacting a top surface of the first conductive semiconductor and a top surface of the adhesive layer, and a second electrode contacting to the second conductive semiconductor layer, and wherein the adhesive layer contacting the first electrode is spaced apart from the second electrode.

DETAILED DESCRIPTION OF THE EMBODIMENTS

Figure 1:
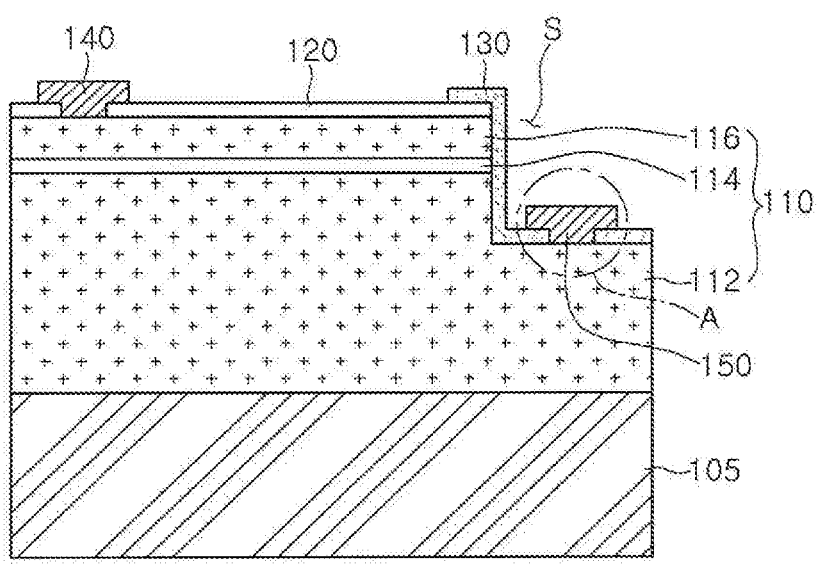
FIG. 1 is a sectional view showing a light emitting, device according to a first embodiment.

In the description of the embodiments, it will be understood that, when a layer (or film), a region, a pattern, or a structure s referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 2:
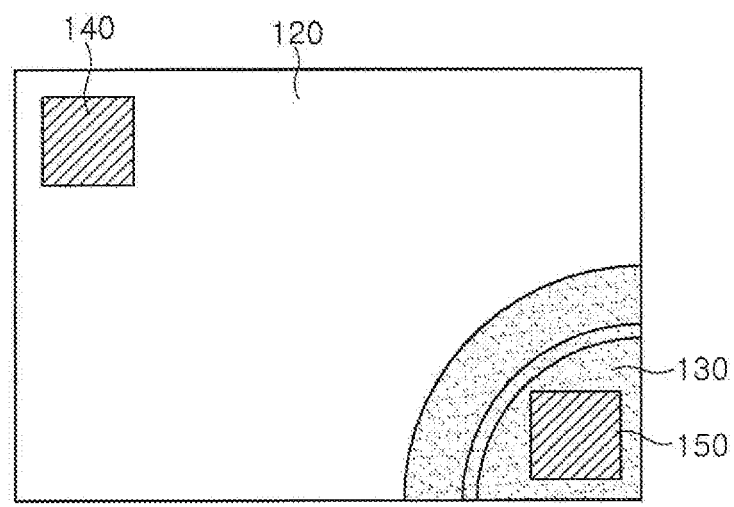
FIG. 2 is a plan view showing the light emitting device of FIG. 1.
Figure 3:
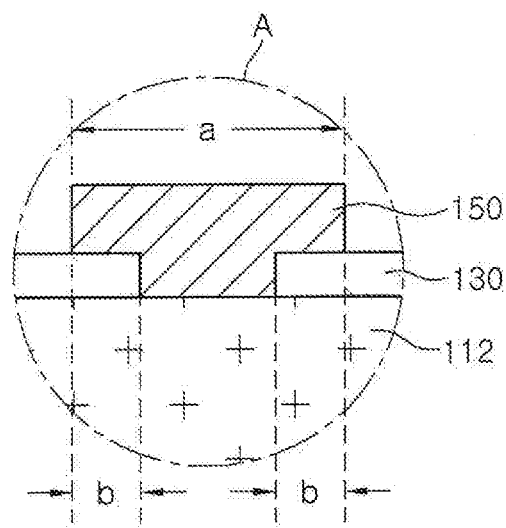
FIG. 3 is an enlarged view of a region A of the light emitting device of FIG. 1.

FIG. 1 is a sectional view showing a light emitting device 100 according to a first embodiment FIG. 2 is a plan view showing the light emitting device of FIG. 1, and FIG. 3 is an enlarged view of a region A of the light emitting device of FIG. 1.

Referring to FIGS. 1 to 3, the light emitting device 100 according to the first embodiment includes a growth substrate 105, a light emitting structure 110 formed by sequentially stacking a first conductive semiconductor layer 112, an active layer 114, and a second conductive semiconductor layer 116 on the growth substrate 105, and having a region S in which a top surface of the first conductive semiconductor layer 112 is exposed, an adhesive layer 130 allowing at least a portion of the top surface of the first conductive semiconductor layer 112 in the region S to be exposed, a first electrode 150 formed on both, the first conductive semiconductor layer 112 of the region S and the adhesive layer 130, a transmissive electrode layer 120 formed on the second conductive semiconductor layer 116, and a second electrode 140 formed on both of the second conductive semiconductor layer 116 and the transmissive electrode layer 120.

The growth substrate 105 may include at least one selected from the group consisting of single crystalline sapphire ($Al_2O_3$), SiC, GaAs, GaN; ZnO, Si, GaP, InP, Ge, SiGe, but the embodiment is not limited thereto.

The growth substrate 105 may be provided on a top surface thereof with a predetermined pattern or may be inclined to accelerate the growth of the light emitting structure 110 and improve the light emission efficiency of the light emitting device, but the embodiment is not limited thereto.

The light emitting structure 110 may be grown from the growth substrate 105.

The light, emitting structure 110 may include the first conductive semiconductor layer 112, the active layer 114, and the second conductive semiconductor layer 116. A buffer layer or an undoped semiconductor layer may be disposed between the growth substrate 105 and the light emitting structure 110 to reduce lattice constant mismatch between the growth substrate 105 and the light emitting structure 110 or improve the crystalline of the light emitting structure 110.

For example, the first conductive semiconductor layer 112 may include an N type semiconductor layer doped with N type dopants. The N type semiconductor layer may include a semiconductor material having a compositional formula of $In_xAl_yGa_{1-x-y}N$ ($0 \leq x \leq 1$, $0 \leq y \leq 1$, $0 \leq x+y \leq 1$). For example, the N type semiconductor layer may be selected from the group consisting of InAlGaN, GaN, AlGaN, AlInN, InGaN, AlN, and InN, and may be doped with N type dopants such as Si, Ge, or Sn.

If the active layer 114 has a quantum well structure, the active layer 114 may have a single quantum well structure having a well layer having a compositional formula of InxAlyGa1yN ($0 \leq x \leq 1$, $0 \leq y \leq 1$, $0 \leq x+y \leq 1$) and a barrier layer having a compositional formula of InaAlbGa1-a-bN ($0 \leq a \leq 1$, $0 \leq b \leq 1$, $0 \leq a+b \leq 1$). The well layer may include material having energy bandgap lower than that of the barrier layer.

The active layer 114 may generate light by energy generated in the recombination of the electrons and the holes provided from the first and second conductive semiconductor layers 112 and 116.

For example, the second conductive semiconductor layer 116 may include a P type semiconductor including P type dopants. The P type semiconductor layer may include a semiconductor material having a compositional formula of $In_xAl_yGa_{1-x-y}N$ ($0 \leq x \leq 1$, $0 \leq y \leq 1$, $0 \leq x+y \leq 1$). For example, the P type semiconductor layer may be selected from the group consisting of InAlGaN, GaN, AlGaN, AlInN, InGaN, AlN, and InN. The P type semiconductor layer may be doped with P type dopants such as Mg, Zn, Ca, Sr, and Ba.

The buffer layer (not shown) and the undoped semiconductor layer (not shown) may include a semiconductor material having a compositional formula of $In_xAl_yGa_{1-x-y}N$ ($0 \leq x \leq 1$, $0 \leq y \leq 1$, $0 \leq x+y \leq 1$). For example, the buffer layer (not shown) and the undoped semiconductor layer may be selected from the group consisting of InAlGaN, GaN, AlGaN, AlInN, InGaN, AlN, and InN. The buffer layer and the undoped semiconductor layer are not doped with conductive dopants. Accordingly, the buffer layer and the undoped semiconductor layer may have electrical conductivity remarkably lower than that of the first and second conductive semiconductor layers 112 and 116.

The transmissive electrode layer 120 may be formed on the second conductive semiconductor layer 116 of the light emitting structure. The transmissive electrode layer 120 spreads current, so that the current can be prevented from being centralized around the second electrode 140.

The transmissive electrode layer 120 may have a single layer structure or a multiple layer structure including at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, Ni, Ag, and Au.

As shown in FIG. 1, the transmissive electrode layer 120 exposes at least a portion of the second conductive semiconductor layer 116. The transmissive electrode layer 120 may be actually formed throughout the whole top surface of the second conductive semiconductor layer 116, but the embodiment is not limited thereto.

The second electrode 140 may be formed one of the transmissive electrode layer 120 and the second conductive semiconductor layer 116, or may be formed on both of the transmissive electrode layer 120 and the second conductive semiconductor layer 116.

The second electrode 140 may supply power to the light emitting structure 110 together with the first electrode 150.

For example, the second electrode 140 may have a single layer structure or a multiple layer structure including at least one selected from the group consisting of Au, Al, Ag, Ti, Cu, Ni, and Cr, but the embodiment is not limited thereto.

In the region S of the light emitting structure 110, a portion, of the top surface of the first conductive semiconductor layer 112 is exposed through the Mesa-Etching process. The region S may be formed at a portion of lateral surfaces of the light emitting structure 110.

The adhesive layer 130 may be formed on the top surface of the first conductive semiconductor layer 112 of the region S in such a manner that at least a portion of the top surface of the first conductive semiconductor layer 112 can be exposed.

In other words, at least a portion of the adhesive layer 130 may overlap with the first electrode 150 in a vertical direction. The adhesive layer 130 improves the adhesive strength between the first conductive semiconductor layer 112 and the first electrode 150, so that the reliability for the light emitting device 100 can be improved.

The reliability can be acquired because the adhesive strength between the first electrode 150 and the adhesive layer 130 and the adhesive strength between the adhesive layer 130 and the first conductive semiconductor layer 112 are greater than the adhesive strength between the first conductive semiconductor layer 112 and the first electrode 150. Preferably, in order to maximize the above effect, at least portions of the first electrode 150 and the adhesive layer 130 perpendicularly overlap with each other.

Referring to FIG. 3 the width (2*b) of a bottom surface of the first electrode 150 perpendicularly overlapping with the adhesive layer 130 may correspond to 5% to 90% of the whole width (a) of a top surface of the first electrode 150.

The overlap area between the first electrode 150 and the first conductive semiconductor layer 112 may correspond to 10% to 95% of the whole area (a) of the top surface of the first electrode 150. The adhesive layer 130 is embedded between the first electrode 150 and the first conductive semiconductor layer 112, and this structure can improve the extraction efficiency of light traveling toward the first electrode 150.

In order to more firmly bond the adhesive layer 130 between the first electrode 150 and the first conductive semiconductor layer 112, a concave-convex pattern is formed on top and bottom surfaces of the adhesive layer 130, so that the surface area of the adhesive layer 130 can be maximized.

The adhesive layer 130 preferably includes a material having a refractive index lower than that of the light emitting structure 110 to improve the light extraction efficiency.

The transmissive insulating material of the adhesive layer 130 may include at least one selected from the group consisting of $SiO_2$, $SiO_x$, $SiO_xN_y$, $Si_3N_4$, $TiO_2$, and $Al_2O_3$. The adhesive layer 130 may leave a multiple layer structure including different materials. If the adhesive layer 130 has a multiple layer structure, the adhesive layer 130 may have a repeated stack structure of a first layer including a material (e.g., $Al_2O_3$) having a high refractive index of 1.7 to 1.8 and a second layer including a material ($SiO_2$) having low refractive index of 1.5 to 1.6.

The adhesive layer 130 may include transmissive conductive material. The adhesive layer 130 may have a multiple layer structure formed by stacking a second layer including a transmissive conductive material on a first layer including the transmissive insulating material. The adhesive layer 130 may have a thickness to the extent that the electrical operation of the light emitting structure is not affected by the thickness. The transmissive conductive material may have a single layer structure or a multiple layer structure including at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$ and $RuO_x$. In this case, the refractive index of the ITO is about 2.5.

In addition, the adhesive layer 130 is formed by stacking a first layer having a high refractive index and a second layer having a low refractive index by using transmissive insulating material and transmissive conductive material. If the difference between the two refractive indexes is less than the refractive index of light emitting structure, an inverse stack structure is formed. In other words, the second layer having a low refractive index and the first layer having a high refractive index are sequentially stacked.

Figure 4:
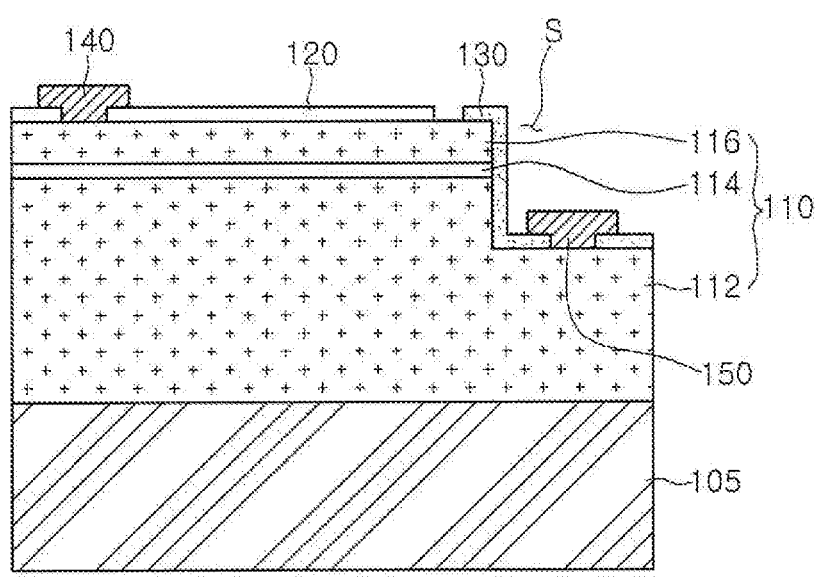
FIG. 4 is a sectional view showing a light emitting device according to a second embodiment.
Figure 5:
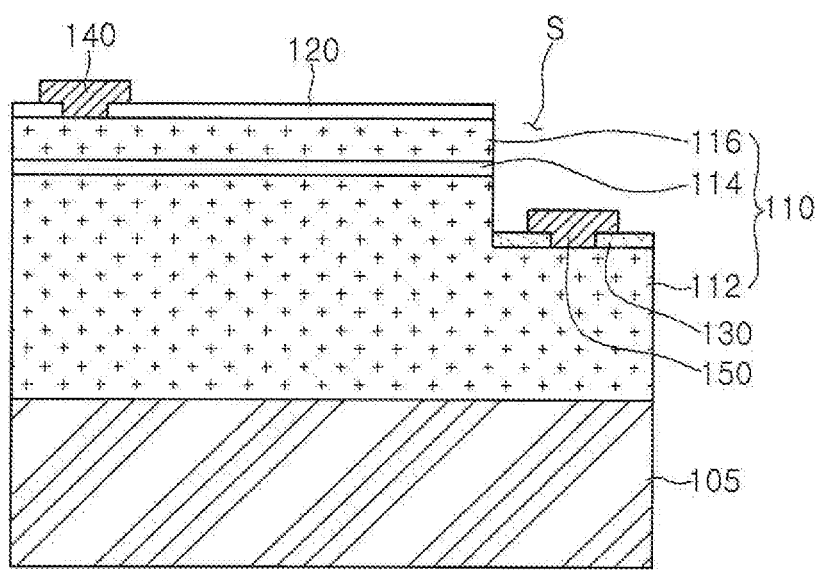
FIG. 5 is a sectional view showing a light emitting device according to a third embodiment.
Figure 6:
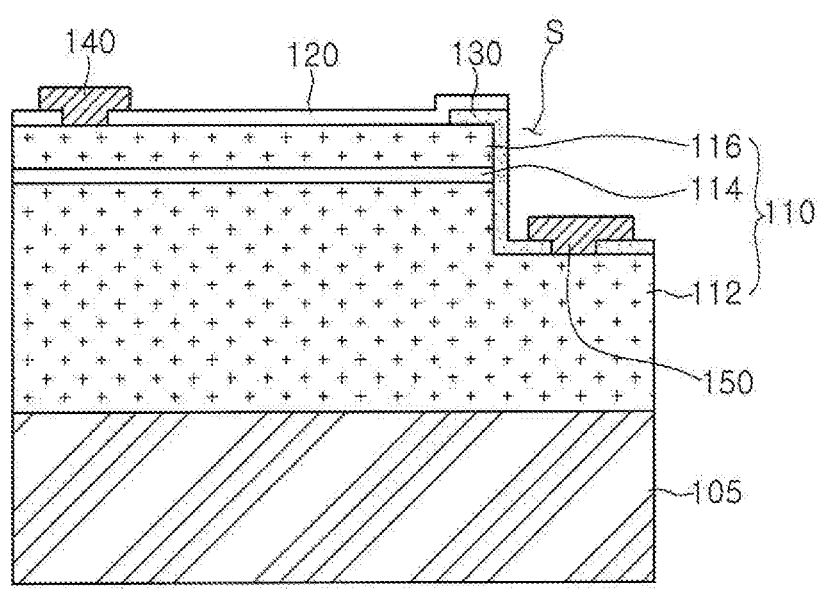
FIG. 6 is a sectional view showing a light emitting device according to a fourth embodiment.

Meanwhile, the adhesive layer 130 may have various shapes. FIGS. 4 to 6 are sectional views showing a sight emitting device according to the second embodiment to the fourth embodiment.

Referring to FIGS. 1 to 3, in the light emitting device 100 according to the first embodiment, the adhesive layer 130 may overlap with the lateral surface of the light emitting structure 110, for example, the lateral surface of the active layer 114, the lateral surface of the second conductive semiconductor layer 116, and a portion of the top surface of the transmissive electrode layer 120, as well as the top surface of the first conductive semiconductor layer 112 of the region S.

Referring to FIG. 4, in a light emitting device 100A according to the second embodiment, the adhesive layer 130 may overlap with the lateral surface of the light emitting structure 110, for example, the lateral surface of the active layer 114, the lateral surface of the second conductive semiconductor layer 116, and a portion of the top surface of the second conductive semiconductor layer 116, as well as at the top surface of the first conductive layer 112 of the region S. In this case, the transmissive electrode layer 120 may be formed on the second conductive semiconductor layer 116 in such a manner that the transmissive electrode layer 120 is spaced apart from one end of the adhesive layer 130 formed on the second conductive semiconductor layer 116.

Referring to FIG. 5, in a light emitting device 100B according, to the third embodiment, the adhesive layer 130 may be formed only on the top surface of the first conductive semiconductor layer 112 of the region S.

Referring to FIG. 6, in a light emitting device 100C according to a fourth embodiment, the adhesive layer 130 may overlap with the lateral surface of the light emitting structure 110, for example, the lateral surface of the active layer 114, the lateral surface of the second conductive semiconductor layer 116, and a portion of the top surface of the second conductive semiconductor layer 116, as well as the top surface of the first conductive semiconductor layer 112. In this case, the transmissive electrode layer 120 may be not only formed on the second conductive semiconductor layer 116, but on one end of the adhesive layer 130 on the second conductive semiconductor layer 116. In other words, one end of the transmissive electrode layer 120 may overlap with one end of the adhesive layer 130.

In the light emitting devices 100, 100A, and 100C according to the first, second, and fourth embodiments, since the adhesive layer 130 simultaneously contacts the first conductive semiconductor layer 112, the active layer 114, and the second conductive semiconductor layer 116, the adhesive layer 130 has to include transmissive insulating material to prevent electrical short between the layers 112, 114, and 116.

In a light emitting device 100B according to a third embodiment, since the adhesive layer 130 is formed at an upper portion of the first conductive semiconductor layer 112, electrical short does not occur. Accordingly, the adhesive layer 130 may include transmissive conductive material or transmissive insulating material. The adhesive layer 130 may have a single layer structure or a multiple layer structure including $SiO_2$, $SiO_x$, $SiO_xN_y$, $Si_3N_4$, $TiO_2$, $Al_2O_3$, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$ and $RuO_x$.

The first electrode 150 may be formed on the adhesive layer 130 and the first conductive semiconductor layer 112. A portion of a bottom surface of the first electrode 150 contacts the top surface of the first conductive semiconductor layer 112, and a remaining portion of the bottom surface of the first electrode 150 can contact the top and lateral surfaces of the adhesive layer 130. The first electrode 150 may have a single layer structure or a multiple layer structure including at least one selected from the group consisting of Au, Al, Ag, Ti, Cu, Ni, and Cr, but the embodiment is not limited thereto.

If the first electrode 150 has a multiple layer structure the lower most layer of the first electrode 150, which is adjacent to the interface between the first electrode 150 and the first conductive semiconductor layer 112 or the adhesive layer 130, preferably includes Ti, Ni, or Cr representing high adhesive strength. In addition, the upper most layer of the first electrode 150 preferably includes Au or Ti representing high adhesive strength so that wire bonding can easily performed.

Hereinafter, the manufacturing process of the light emitting device 100 according to the first embodiment will be described in detail.

FIGS. 7 to 11 are views showing the manufacturing process of a light emitting device according to the first embodiment.

Figure 7:
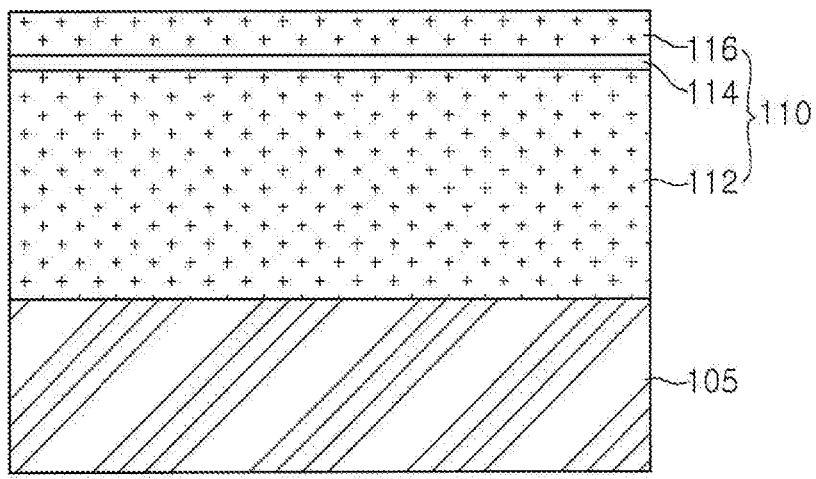
FIGS. 7 to 11 are views showing, the manufacturing process of the light emitting device according to the first embodiment.

Referring to FIG. 7, the light emitting structure 110 may be formed by sequentially forming the first conductive semiconductor layer 112, the active layer 114, and the second conductive semiconductor layer 116 on the growth substrate 105.

The light emitting structure 110 may be formed through MOCVID (Metal Organic Chemical Vapor Deposition), CVD (Chemical Vapor Deposition), PECVD (Plasma-Enhanced Chemical Vapor Deposition), MBE (Molecular Beam Epitaxy), or HVPE (Hydride Vapor Phase Epitaxy) but the embodiment is not limited thereto.

Figure 8:
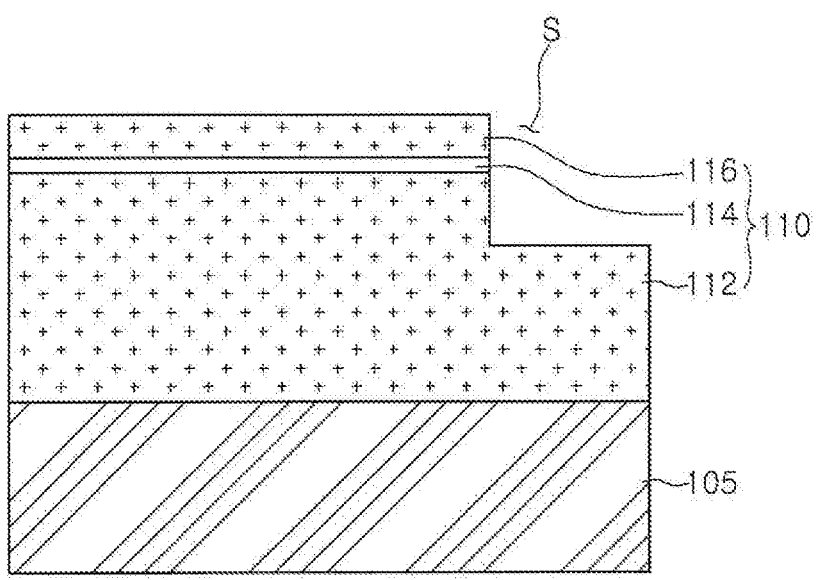

Referring to FIG. 8, a mesa etching is performed with respect to a portion of a corner of the light emitting structure 110, that is, region S such that at least a portion of the top surface of the first conductive semiconductor layer 112 is exposed.

After forming a pattern for etching on the light emitting structure 110 through a photolithography process, the mesa etching is performed by employing the pattern as a mask. The mesa etching process may include a dry etching process or a wet etching process.

Figure 9:
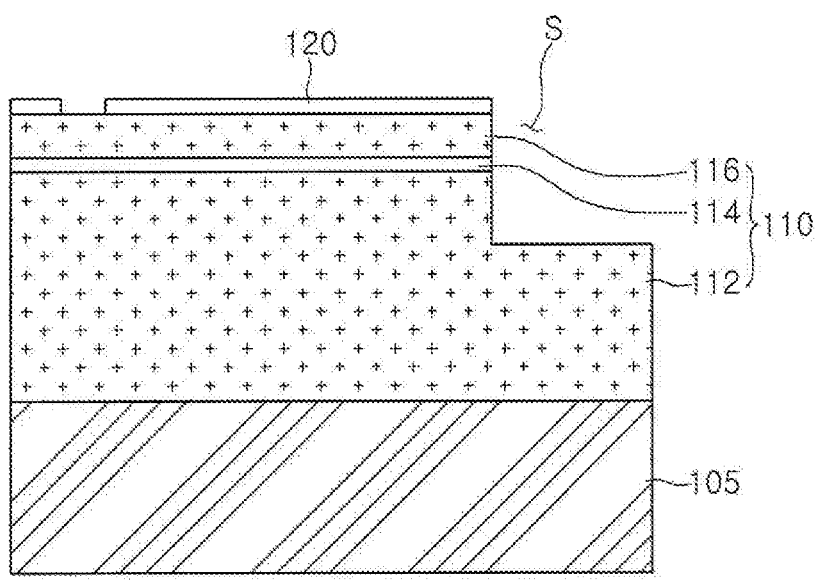

Referring to FIG. 9, the transmissive electrode layer 120 may be formed on the second conductive semiconductor layer 116.

The transmissive electrode layer 120 may be formed on the entire portion of the top surface of the second conductive semiconductor layer 116 or a portion of the second conductive semiconductor layer 116.

The transmissive electrode layer 120 may be formed through one of E-beam deposition, sputtering, and PECVD (Plasma Enhanced Chemical Vapor Deposition), but the embodiment is not limited thereto.

Figure 10:
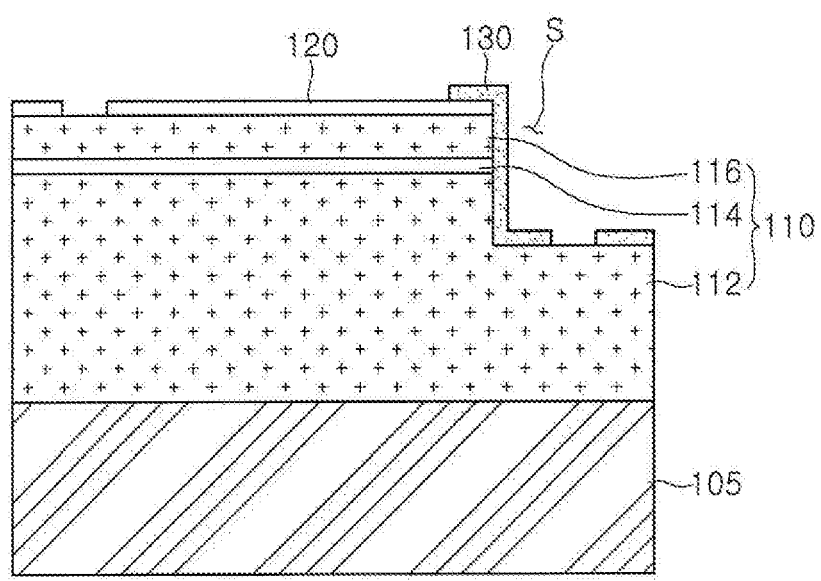
Figure 11:
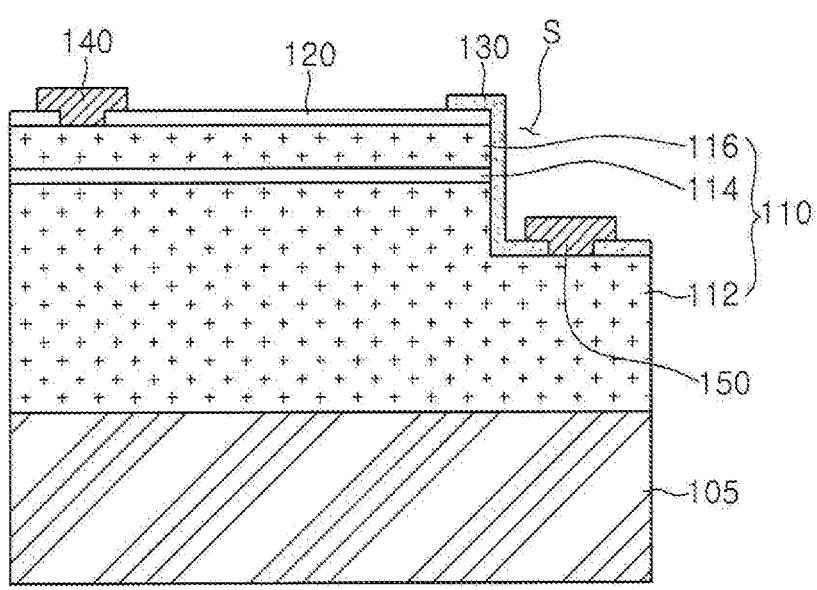

Referring to FIG. 10, the adhesive layer 130 may be formed on at least the top surface of the first conductive semiconductor layer 112 of the region S. The adhesive layer 130 may be formed on the top surface, and the lateral surface of the first conductive semiconductor layer 112, the lateral surface of the active layer 114, and the lateral surface and the top surface of the second conductive semiconductor layer 116. In this case, one end of the adhesive layer 130 may be formed at a portion of the top surface of the second conductive semiconductor layer 116.

The adhesive layer 130 may expose at least a portion of the top surface of the first conductive semiconductor layer 112.

After the mask has been formed, the adhesive layer 130 may be formed through E-beam deposition, sputtering, and PECVD (Plasma Enhanced Chemical Vapor Deposition), but the embodiment is not limited thereto.

The adhesive layer 130 may be patterned through an etching process such that the second electrode 140 contacts the first conductive semiconductor layer 112.

Referring to FIG. 1, the first electrode 150 is formed on the first conductive semiconductor layer 112 and the adhesive layer 130, and the second electrode 140 is formed on the second conductive semiconductor layer 116 and the transmissive electrode layer 120, thereby providing the light emitting device 100 according to the first embodiment. A portion of the bottom surface of the first electrode 150 may be formed on the first conductive semiconductor layer 112, and a remaining portion of the bottom surface of the first electrode 150 may be formed on the adhesive layer 130. A portion of the second electrode 140 may be formed on the second conductive semiconductor layer 116, and a remaining portion of the second electrode 140 may be formed on the transmissive electrode layer 120.

The first and second electrodes 140 and 150 may be formed through a deposition scheme or a plating scheme, but the embodiment is not limited thereto.

Hereinafter, a light emitting device according to the fifth embodiment will be described in detail, and the structures and components identical to those of the previous embodiments will be not further described or will be briefly described.

Figure 12:
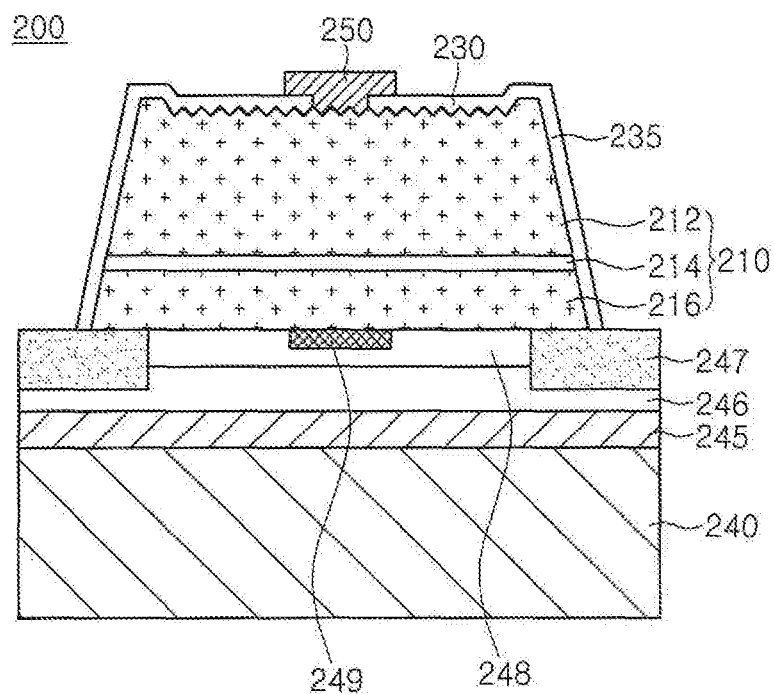
FIG. 12 is a sectional view showing a light emitting device according to a fifth embodiment.

FIG. 12 is a sectional view showing a light emitting device according to a fifth embodiment.

Referring to FIG. 12, a light emitting device 200 according to a fifth embodiment includes a conductive support member 240, an adhesive metallic layer 245 on the conductive support member 240, a reflective layer 246 on the adhesive metallic layer 245, an ohmic layer 248 on the reflective layer 246, a protection layer 247 on an outer peripheral portion of a top surface of the reflective layer 246, a light emitting structure 210 on the ohmic layer 248 and the protection layer 247, a passivation layer 235 on a lateral surface of the light emitting structure 210, an adhesive layer 230 on a top surface of the light emitting structure 210, and an electrode 250 on the light emitting structure 210 and the adhesive layer 230.

The conductive support member 240 supports the light emitting structure 210. The conductive support member 240 acts as an electrode to supply power to the light emitting device 200 together with the electrode 250. For example, the conductive support member 240 may include at least one selected from the group consisting of copper (Cu), gold (Au), nickel (Ni), molybdenum (Mo), copper-tungsten (Cu—W), and a carrier-wafer (including Si, Ge, GaAs, ZnO, SiC, or SiSe).

The adhesive metallic layer 245 may be formed on the conductive support member 240. The adhesive metallic layer 245 may include metallic material representing superior adhesive strength in order to improve interfacial adhesive strength between the conductive support member 240 and the reflective layer 246. For example, the adhesive metallic layer 245 may have a single layer structure or a multiple layer structure including at least one of Ti, Au, Sn, Ni, Cr, Ga, In, Bi, Cu, Ag and Ta. However, if the conductive support member 240 is formed through a plating or deposition scheme instead of a bonding scheme, the adhesive metallic layer 245 may be not formed.

The reflective layer 246 may be formed on the adhesive metallic layer 245. The reflective layer 246 reflects upward light incident from the light emitting structure 210 so that the light emission efficiency of the light emitting device 200 can be improved. For example, the reflective layer 246 may include metal including at least one of silver (Ag), aluminum (Al), palladium (Pd), copper (Cu), and platinum (Pt) or the alloy thereof.

The ohmic layer 248 may be formed on the reflective layer 246. The ohmic layer 248 may be formed to form the ohmic contact between the reflective layer 246 and the light emitting structure 210.

The ohmic layer 248 may selectively include a transmissive conductive layer or metal. The ohmic layer 248 may have a single layer structure or a multiple layer structure including at least one of ITO, IZO, IZTO, IAZO, IGZO, IGTO, AZO, ATO, GZO, IrOx, RuOx, Ni, Ag and Au.

The protection layer 247 may be formed at an outer peripheral portion of the top surface of the reflective layer 246. In other words, the protection layer 247 may be formed at an outer peripheral portion between the light emitting structure 210 and the conductive support member 240.

The protection layer 247 prevents the conductive support member 240 from being electrically shorted with the light emitting structure 210, so that the reliability for the manufacturing process can be improved.

For example, the protection layer 247 may in include electrically insulating material or material having electrical conductivity lower than that of the light emitting structure 210. For example, the protection layer 247 may include at least one selected from the group consisting of $SiO_2$, $Si_xO_y$, $Si_3N_4$, $Si_xN_y$, $SiO_xN_y$, $Al_2O_3$, $TiO_2$, ITO, AZO, and ZnO.

A current blocking layer 249 may be disposed between the ohmic contact layer 248 and the light emitting structure 210 such that at least a portion of the current blocking layer 249 perpendicularly overlaps with the electrode 250. The current blocking layer 249 can prevent current from being concentrated on the shortest distance between the electrode 250 and the conductive support member 240.

The current blocking layer 249 may include electrical insulating material, or material forming schottky contact with a second conductive semiconductor layer 216. For example the current blocking layer 249 may include at least one selected from the group consisting of ZnO, $SiO_2$, $SiO_x$, $SiO_xN_y$, $Si_3N_4$, $Al_2O_3$, $TiO_x$, Ti, Al, and Cr.

The light emitting structure 210 may be formed on the ohmic contact layer 248 and the protection layer 247. The light emitting structure 210 includes a first conductive semiconductor layer 216, an active layer 214 on the first conductive semiconductor layer 216, and a second conductive semiconductor layer 212 on the active layer 214, but the embodiment is not limited thereto.

The light emitting structure 210 may include group III to V compound semiconductors, and may generate light through the recombination of electrons and holes. Since the light generation through the recombination of the electrons and holes has been described above, the details thereof will be omitted.

A roughness structure or a concave-convex structure may be formed on a top surface of the light emitting structure 210, that is, a top surface of the second conductive semiconductor layer 212. The roughness structure or the concave-convex structure may include roughness having a random shape formed through a wet etching process, or a periodical pattern such as a photonic crystal structure formed through a patterning process.

The roughness structure or the concave-convex structure can improve the light extraction efficiency of the light emitting structure 200. In addition, the roughness structure or the concave-convex structure widens the surface area of the interface between the light emitting structure 210 and the adhesive layer 230, so that the adhesive strength between the light emitting structure 210 and the adhesive layer 230 can be improved.

The passivation layer 235 may be formed on a lateral surface of the light emitting structure 210. The passivation layer 235 can prevent the light emitting structure 210 from being electrically shorted with an external electrode. For example, the passivation layer 235 may be selected from the group consisting of $SiO_2$, $SiO_x$, $SiO_xN_y$, $Si_3N_4$, and $Al_2O_3$, but the embodiment is not limited thereto.

The adhesive layer 230 may be formed on at least a portion of the top surface of the light emitting structure 210. As shown in FIG. 12, the adhesive layer 230 may expose the portion of the top surface of the second conductive semiconductor layer 212. The adhesive layer 230 may include material the same as that of the passivation layer 235. The adhesive layer 230 and the passivation layer 235 may be integral with each other while being formed simultaneously through the same process. The adhesive layer 230 may extend from the passivation layer 235. The adhesive layer 230 and the passivation layer 235 may include different materials and be formed through different processes in such a manner that the adhesive layer 230 is spaced apart from the passivation layer 235.

The electrode 250 may be formed on a portion of a top surface of the adhesive layer 230 and a portion of a top surface of the second conductive semiconductor layer 212. In other words, a portion of a bottom surface of the electrode 250 overlaps with a top surface of the second conductive semiconductor layer 212, and a remaining portion of the bottom surface of the electrode 250 overlaps with the adhesive layer 230.

The adhesive layer 230 improves the adhesive strength between the second conductive semiconductor layer 212 and the electrode 250, so that the reliability for the light emitting device 200 can be improved.

The reliability can be acquired because the adhesive strength between the electrode 250 and the adhesive layer 230 and the adhesive strength between the adhesive layer 230 and the second conductive semiconductor layer 212 are greater than the adhesive strength between the second conductive semiconductor layer 212 and the electrode 250.

In order to maximize the above effect, at least portions of the electrode 250 and, the adhesive layer 230 perpendicularly overlap with each other. The width of the bottom surface of the electrode 250 perpendicularly overlapping with the adhesive layer 230 may correspond to 5% to 90% of the whole width of the top surface of the electrode 250. The overlap area between the electrode 250 and the second conductive semiconductor layer 212 may correspond to 10% to 95% of the area of the top surface of the electrode 250. A concave-convex structure or the roughness structure are formed on the top surface and the bottom surface of the adhesive layer 230 to increase the surface area of the adhesive layer 230 such that the adhesive layer 230 can more firmly bond the electrode 250 to the second conductive semiconductor layer 212.

The adhesive layer 230 may have a single layer structure or a multiple layer structure including at least one selected from the group consisting of, $SiO_2$, $SiO_x$, $SiO_xN_y$, $Si_3N_4$, $TiO_2$, $Al_2O_3$, ITO, IZO, IZTO, IAZO, IGZO, IGTO, AZO, ATO, GZO, $IrO_x$, and $RuO_x$, but the embodiment is not limited thereto.

Preferably, the adhesive layer 230 include a material having a refractive index lower than that of the light emitting structure 210 so that light extraction efficiency can be improved.

The electrode 250 may be formed on both of the second conductive semiconductor layer 212 and the adhesive layer 230. The bottom surface of the electrode 250 contacts the top surface and the lateral surface of the adhesive layer 230 while surrounding the top surface and the lateral surface of the adhesive layer 230. Accordingly, the electrode 250 may firmly contact the top surface of the light emitting structure 210.

Hereinafter, the method of manufacturing the light emitting device according to the fifth embodiment will be described, and the structures and components identical to those of the previous embodiments will be not further described or will be briefly described.

FIGS. 13 to 20 are views showing the manufacturing process of the light emitting device according to the fifth embodiment.

Figure 13:
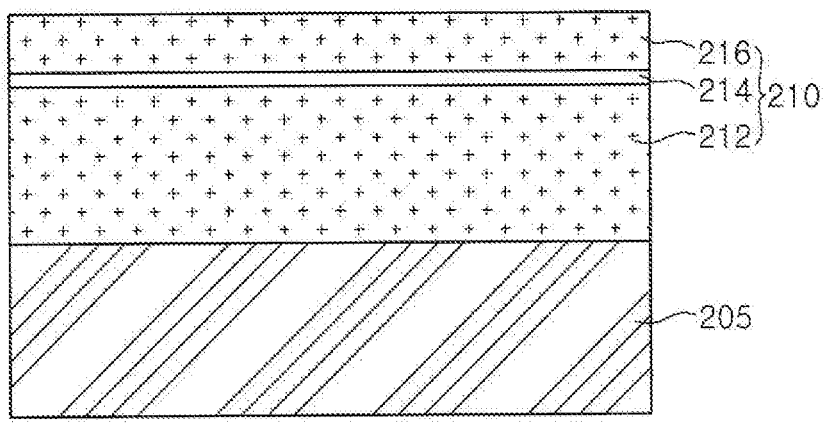
FIGS. 13 to 20 are views showing the manufacturing process of the light emitting device according to the fifth embodiment.

Referring to FIG. 13, the light emitting structure 210 may be formed on a growth substrate 205. The light emitting structure 210 may include at least the second conductive semiconductor layer 212, the active layer 214, and the first conductive semiconductor layer 216.

Figure 14:
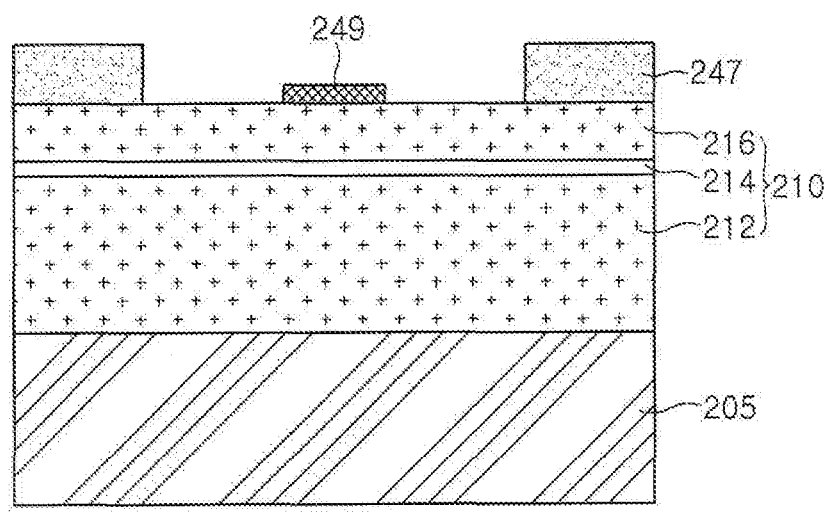

Referring to FIG. 14, the protection layer 247 and the current blocking layer 249 may be formed on the first conductive semiconductor layer 216 of the light emitting structure 210.

The protection layer 247 may be formed at a boundary region of an individual chip (1 chip) by using a mask pattern, and may have a ring shape, a loop shape, or a frame shape. For example, the protection layer 247 may be formed through one of an E-beam deposition scheme, a sputtering scheme, and a PECVD (Plasma Enhanced Chemical Vapor Deposition).

At least a portion of the current blocking layer 249 may overlap with the electrode 250, which will be formed later, perpendicularly to the electrode 250. The current blocking layer 249 may be formed through a deposition scheme or a plating scheme.

Figure 15:
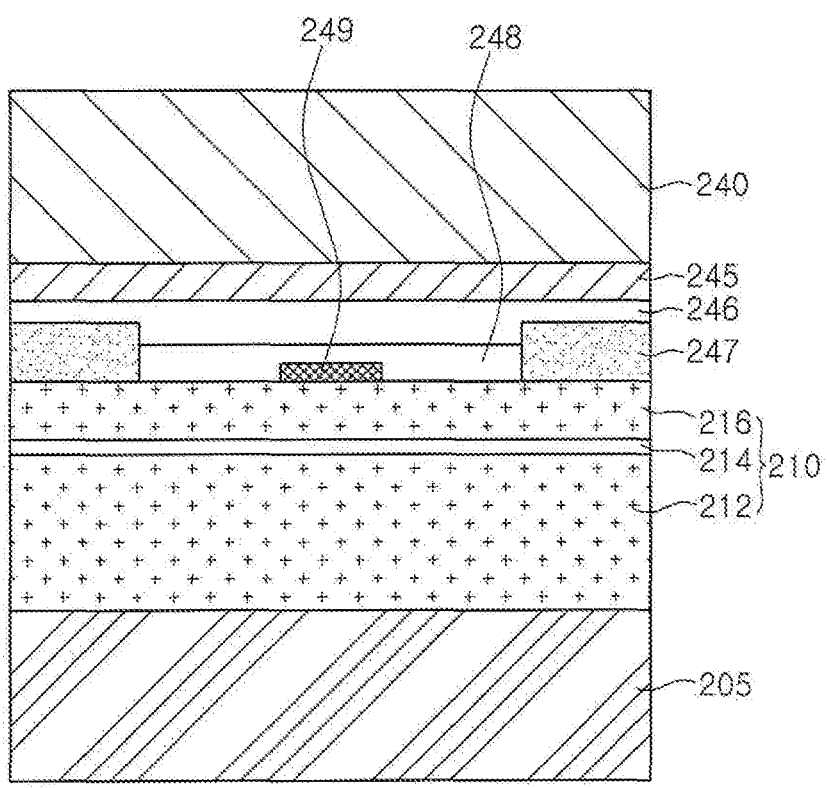

Referring to FIG. 15, the ohmic layer 248 may be formed on both of the first conductive semiconductor layer 216 and the current blocking layer 249, and the reflective layer 246 may be formed on the ohmic layer 248 and the protection layer 247. The adhesive metallic layer 245 may be formed on the reflective layer 246, and the conductive support member 240 may be formed on the adhesive metallic layer 245.

The ohmic layer 248 and the reflective layer 246 may be formed through a deposition scheme or a plating scheme.

The conductive support member 240 may be formed through a deposition scheme or a plating scheme, or may be additionally prepared in the form of a sheet and bonded. If the conductive support member 240 is formed through the deposition or plating scheme, the adhesive metallic layer 245 may be not formed.

Figure 16:
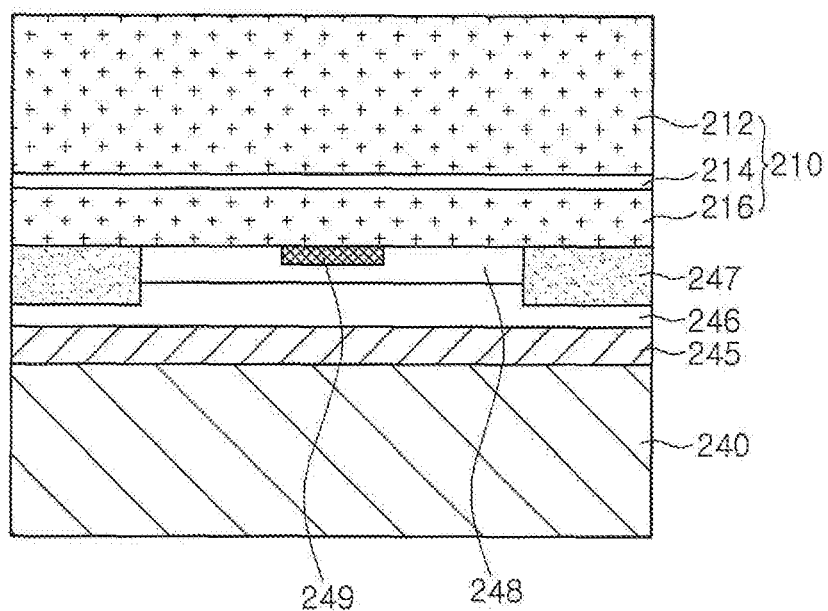

Referring to FIG. 16, the growth substrate 205 may be removed. The growth substrate 205 may be removed through at least one of a LLO (Laser Lift Off) process and a CLO (Chemical Lift Off) process.

The LLO process is to irradiate a laser beam to a rear surface of the growth substrate 205, so that the interface between the growth substrate 205 and the second conductive semiconductor layer 212 is delaminated.

As the growth substrate 205 is removed, the bottom surface of the second conductive semiconductor layer 212 may be exposed. A wet etching process is performed with respect to the second conductive semiconductor layer 212, thereby removing impurities remaining on the surface of the second conductive semiconductor layer 212.

Figure 17:
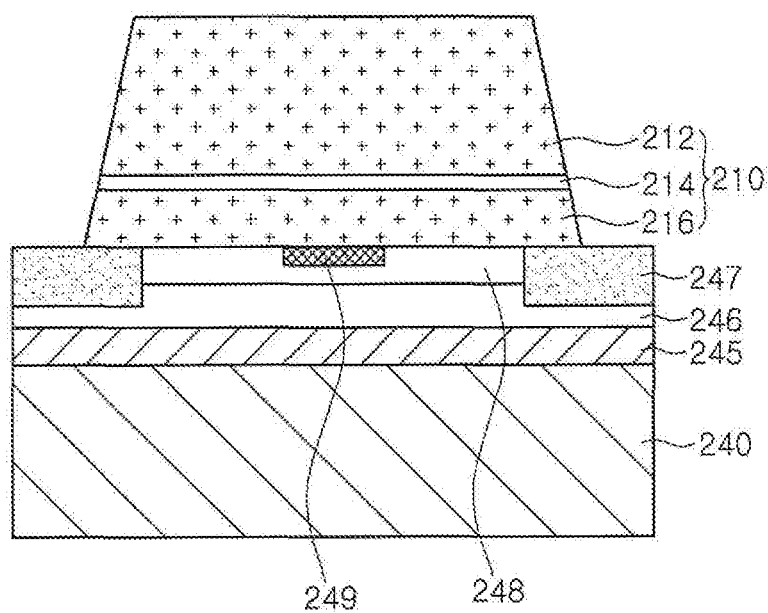

Referring to FIG. 17, an isolation etching is performed with respect to the chip region of the light emitting structure 210, so that a plurality of light emitting devices can be formed.

For example, the isolation etching process may be performed b using dry etching equipment such as ICP (Inductively Coupled Plasma) equipment.

Figure 18:
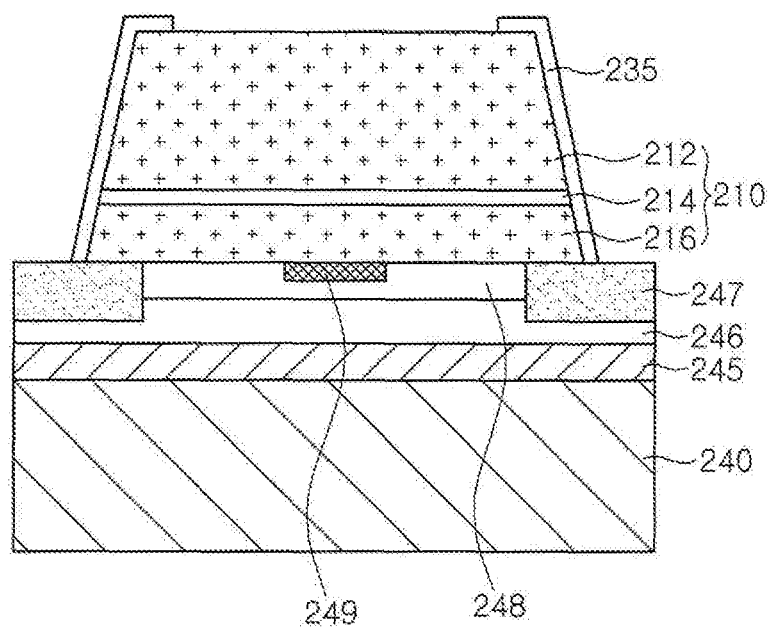

Referring to FIG. 18, the passivation layer 235 may be formed on at least a lateral surface of the light emitting structure 210.

In detail, one end of the passivation layer 235 may be provided on the top surface of the light emitting structure 210, that is, the top surface of the second conductive semiconductor layer 212, and an opposite end of the passivation layer 235 may be formed on the protection layer 247 through the lateral surface of the light emitting structure 210, but the embodiment is not limited thereto.

The passivation layer 235 may be formed through at least one of the E-beam deposition, the PECVD and the sputtering.

Figure 19:
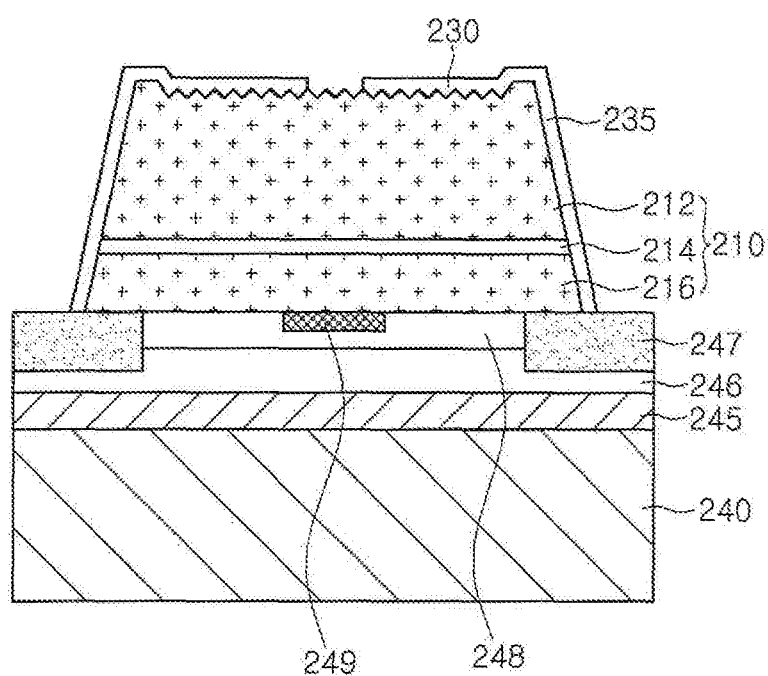

Referring to FIG. 19, the adhesive layer 230 may be formed on the top surface of the light emitting structure 210.

The adhesive layer 230 may be formed through at least one of the E-beam deposition the PECVD, and the sputtering. The adhesive layer 230 may include the same material as that of the passivation layer 235 or may include a material different from that of the passivation layer 235.

A roughness structure or a concave-convex structure may be formed on the top surface of the light emitting structure 210, that is, the top surface of the second conductive semiconductor layer 212 before the adhesive layer 230 has been formed.

A portion of the adhesive layer 230 is removed such that the electrode 250 may contact the second conductive semiconductor layer 212. Accordingly, a portion of the second conductive semiconductor layer 212 may be exposed.

Figure 20:
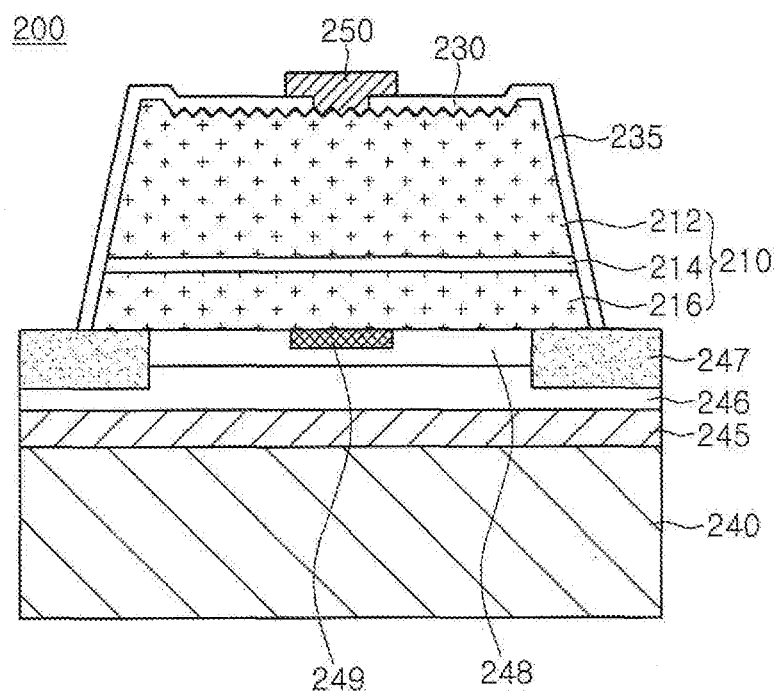

Referring to FIG. 20, the electrode 250 is formed on, the exposed region of the second conductive semiconductor layer 212 of the light emitting structure 210 and the adhesive layer 230, thereby providing the light emitting device 200 according to the fifth embodiment. A portion of the bottom surface of the electrode 250 contacts the top surface of the second conductive semiconductor layer 212, and another portion of the bottom surface of the electrode 250 may contact the top surface and the lateral surface of the adhesive layer 230.

Since the bottom surface of the electrode 250 contacts the top surface and the lateral surface of the adhesive layer 230, the bottom surface of the electrode 250 may more firmly contact the top surface of the light emitting structure 210.

Figure 21:
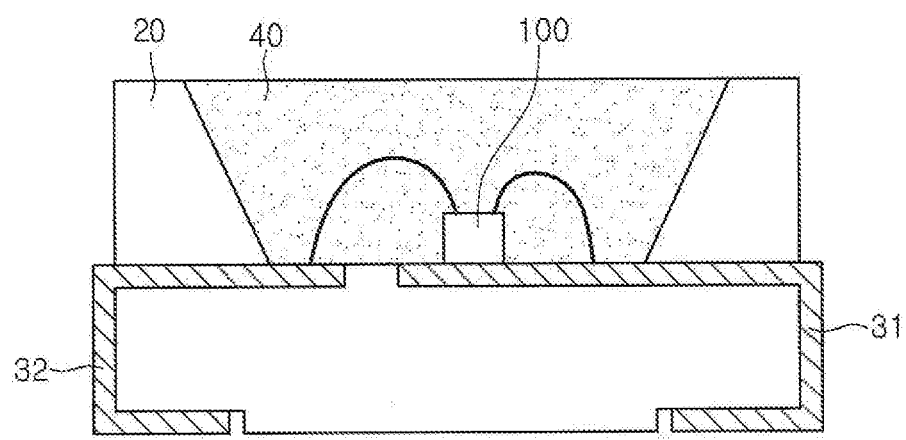
FIG. 21 is a sectional view showing a light emitting device package including a light emitting device according to the embodiment.

FIG. 21 is a sectional view showing a light emitting device package 10 having the light emitting device 100 according to the embodiment.

Referring to FIG. 21, the light emitting device package 10 includes a body 20, first and second lead electrodes 31 and 32 formed on the body 20, the light emitting device 100 mounted on the body 20 and electrically connected to the first and second lead electrodes 31 and 32 and a molding member 40 that surrounds the light emitting device 100.

The body 20 may include silicon, synthetic resin or metallic material. The body 20 may be formed with an inclined inner wall around the light emitting device 100.

The first and second electrode layers 31 and 32 are electrically isolated from each other and supply power to the light emitting device 100. The first and second lead electrodes 31 and 32 can reflect light generated from the light emitting device 100 to increase light efficiency and dissipate heat emitted from the light emitting device 100 to the outside.

The light emitting device 100 can be installed on the body 20 or the first and second lead electrodes 31 and 32.

The light emitting device 100 may be electrically connected to the first and second lead electrodes 31 and 32 through one of a wire, a flip-chip and a die bonding scheme.

The molding member 40 surrounds the light emitting device 100 to protect the light emitting device 100. In addition, the molding member 40 may include luminescent material to change the wavelength of the light emitted from the light emitting device 100.

The light emitting device package may include at least one light emitting device according to the embodiments or may include a plurality of light emitting devices according to the embodiments, but the disclosure is not limited thereto.

Figure 22:
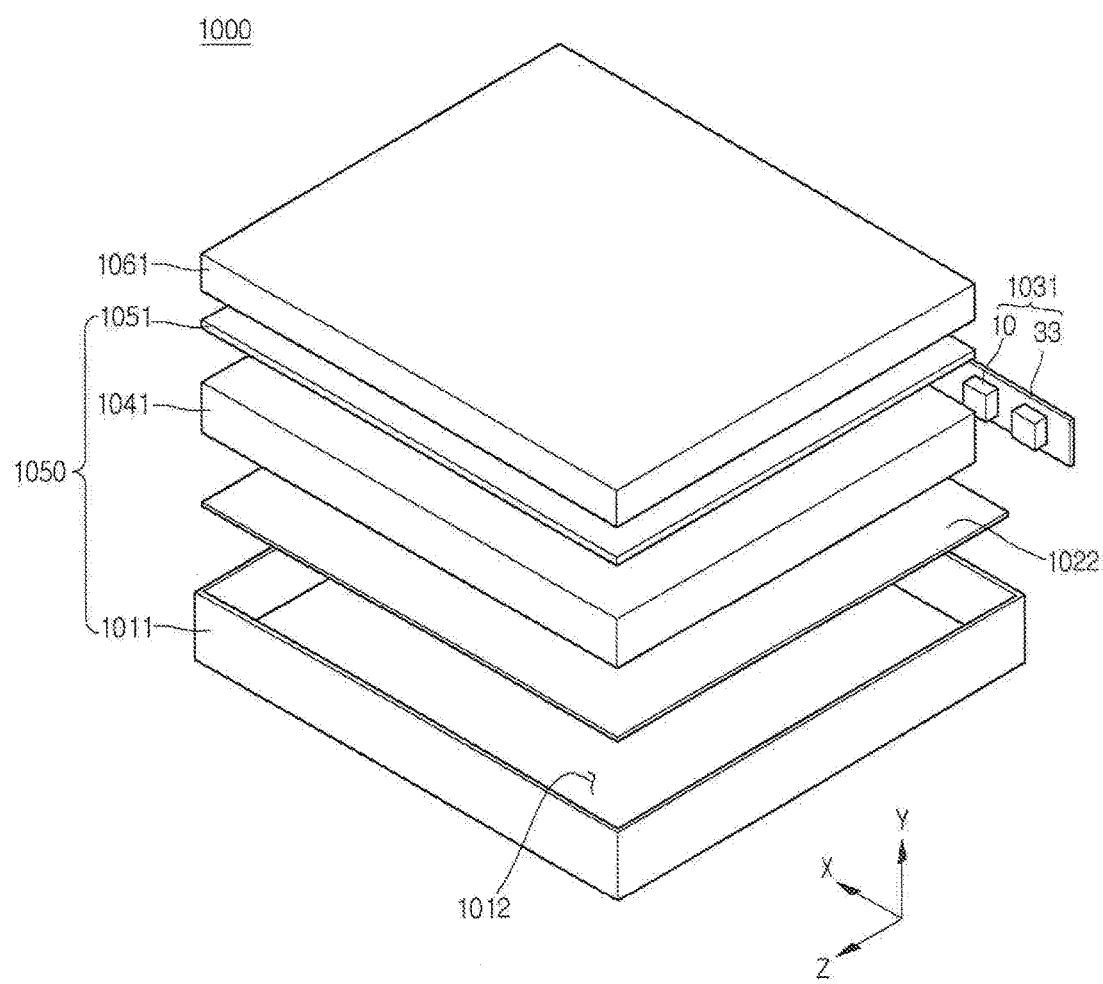
FIG. 22 is an exploded perspective view showing a display apparatus according to the embodiment.
Figure 23:
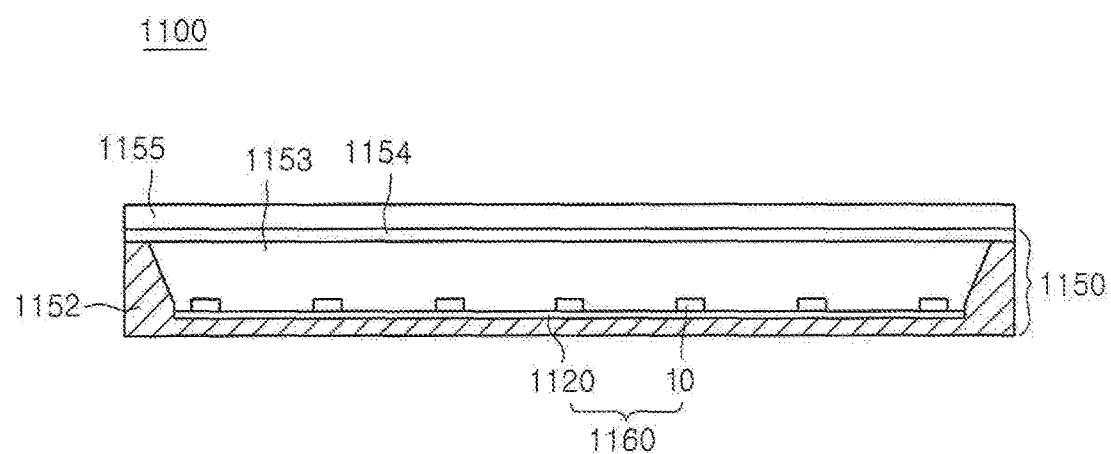
FIG. 23 is a view showing a display apparatus according to the embodiment.
Figure 24:
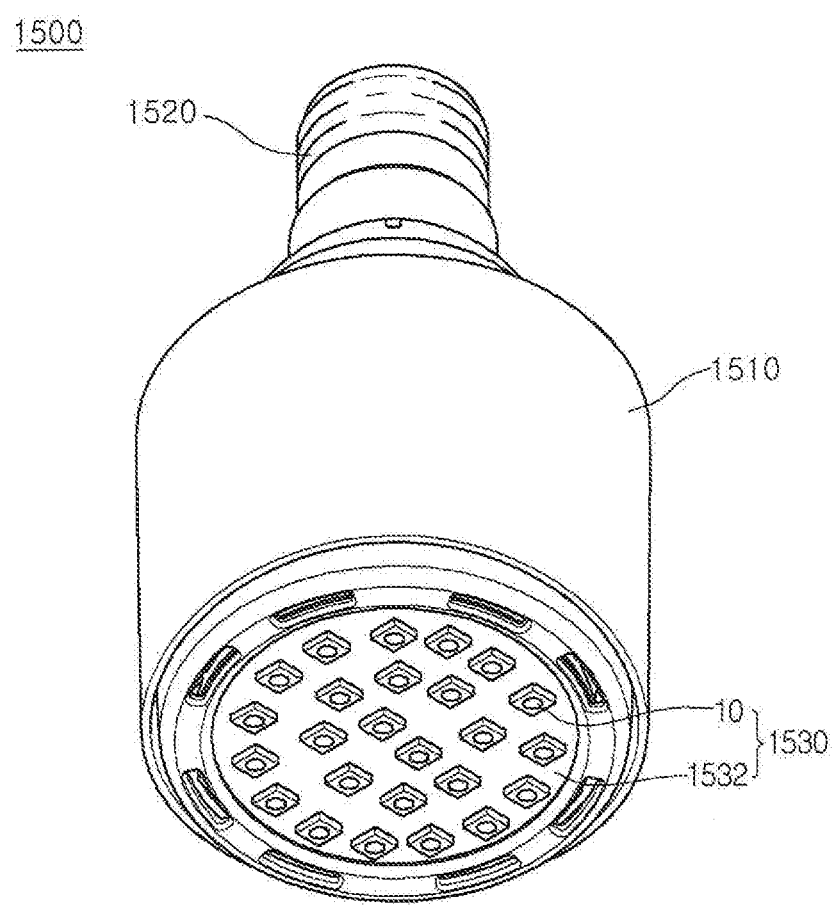
FIG. 24 is a perspective view showing a lighting device according to the embodiment.

The light emitting device or the light emitting device package according to the embodiment may be applied to the light unit. The light unit has an array structure of a plurality of light emitting devices car a plurality of light emitting device packages. The light unit may include the display device as shown in FIGS. 22 and 23 and the lighting device as shown in FIG. 24. In addition, the light unit may include a lighting lamp, a signal lamp, a headlight of a vehicle, and an electric signboard.

FIG. 22 is an exploded perspective view showing the display device according to the embodiment.

Referring to FIG. 22 the display device 1000 includes a light guide plate 1041, a light emitting module 1031 for supplying the light to, the light guide plate 1041, a reflective member 1022 provided below the light guide plate 1041 an optical sheet 1051 provided above the light guide plate 1041, a display panel 1061 provided above the optical sheet 1051 and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light supplied from the light emitting module 1031 to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting, module 1031 is disposed at one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting device packages 30 according to the embodiments. The light emitting device, packages 30 are arranged on the substrate 1033 while being spaced apart from each other at the predetermined interval. The substrate 1033 may include a printed circuit board (PCB), but the embodiment is not limited thereto. In addition the substrate 1033 may also include a metal core PCB (MCPCB) or a flexible PCB (FPCB), but the embodiment is not limited thereto. If the light emitting device packages 30 are installed on the side of the bottom cover 1011 or on a heat dissipation plate, the substrate 1033 may be omitted. The heat dissipation plate partially contacts the top surface of the bottom cover 1011. Thus, the heat generated from the light emitting device packages 30 can be emitted to the bottom cover 1011 through the heat dissipation plate.

In addition, the light emitting device packages 30 are arranged such that light exit surfaces of the light emitting device packages 30 are spaced apart from the light guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which travels downward through the bottom surface of the light guide plate 1041, toward the display panel 1061, thereby improving the brightness of the display panel 1061. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including first and second transparent substrates, which are opposite to each other, and a liquid crystal layer disposed between the first and second substrates. A polarizing plate can be attached to at least one surface of the display panel 1061, but the embodiment is not limited thereto. The display panel 1061 displays information by blocking the light generated from the light emitting module 1031 or allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmittive sheet. For instance, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel 1061 and the brightness enhanced sheet improves the brightness by reusing the lost light. In addition, a protective sheet can be provided on the display panel 1061 but the embodiment is not limited thereto.

The light guide plate 1041 and the optical sheet 1051 can be provided in the light path of the light emitting module 1031 as optical members, but the embodiment is not limited thereto.

FIG. 23 is a sectional view showing a display device according to be embodiment.

Referring to FIG. 23, the display device 1100 includes a bottom cover 1152, a substrate 1120 on which the light emitting device packages 30 are arrayed, an optical member 1154, and a display panel 1155.

The substrate 1120 and the light emitting device packages 30 may constitute the light emitting module 1060. In addition, the bottom cover 1152, at least one light emitting module 1060, and the optical member 1154 may constitute the light unit (not shown). The bottom cover 1151 can be provided with a receiving section 1153, but the embodiment is not limited thereto.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto the display panel 1155, and the brightness enhanced sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 24 is a perspective view showing a lighting device according to the embodiment.

Referring to FIG. 24, the lighting device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 30 installed on the substrate 1532. The light, emitting device packages 30 are spaced apart from each other or arranged in the form of a matrix.

The substrate 1532 includes an insulating member printed with a circuit pattern. For instance, the substrate 1532 includes a PCB, an MCPCB, an FPCB, a ceramic FCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one, light emitting device package 30 is installed on the substrate 1532. Each light emitting device package 30 may include at least one LED (light emitting diode) chip. The LED chip may include an LED that emits the light of visible ray band having red, green, blue or white color and a UV (ultraviolet) LED that emits UV light.

The light emitting device packages 30 of the light emitting module 1530 can be variously arranged to provide various colors and brightness. For instance, the white LED, the red LED and the green LED can be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

According to the embodiment, in the light emitting device, the adhesive layer is provided on the semiconductor layer, and the electrode is provided on the top surface of the semiconductor layer and on the top surface and the lateral surface of the adhesive layer. The adhesive layer having stronger adhesive strength is provided between the semiconductor layer and the electrode, so that the electrode can be prevented from getting out of the light emitting structure. Therefore, the product reliability can be improved.

According to the embodiment, a concave-convex structure is formed on the top surface and the bottom surface of the adhesive layer, so that the adhesive strength can be more firmly enhanced. Accordingly, the product reliability can be maximized.

According to the embodiment, the electrode overlaps with the adhesive layer perpendicularly to the adhesive layer, so that the contact area of the electrode is expanded. Accordingly, the adhesive strength can be more improved.

According to the embodiment, when the adhesive layer includes conductive material, the adhesive layer is, provided only on the semiconductor layer, so that the layers of the light emitting structure can be prevented from being shorted with each other.

According to the embodiment, the adhesive layer is provided on the top surface and the lateral surface of the first conductive semiconductor layer, on the lateral surface of the active layer, and on the lateral surface and the top surface of the second conductive semiconductor layer, so that the lateral surfaces of the light emitting structure can be protected.

According to the embodiment, in the structure of the vertical type light emitting device the passivation layer is formed on the lateral surface of the light emitting structure, and the adhesive layer extends from the passivation layer, so that the manufacturing process can be simplified.

According to the method of manufacturing the light emitting device of the embodiment, a light emitting structure including the first conductive semiconductor layer, the active layer, and the second conductive semiconductor layer is formed on the substrate, an etching process is performed to expose a portion of the first conductive semiconductor layer, an adhesive layer is formed on at least the top surface of the first conductive semiconductor layer, a portion of the adhesive layer is removed to expose the first conductive semiconductor layer, and the electrode is formed on the top surface of the first conductive semiconductor layer and on the top surface and the lateral surface of the adhesive layer.

Any reference in this specification to "one embodiment," "an embodiment," "example embodiment," etc. means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure including a first conductivity type semiconductor layer, an active layer on the first conductivity type semiconductor layer, and a second conductivity type semiconductor layer on the active layer;

a transmissive electrode layer including a metal oxide layer on the second conductivity type semiconductor layer;
an insulating layer on the first conductivity type semiconductor layer and the second conductivity type semiconductor layer;
a first electrode on the first conductivity type semiconductor; and
a second electrode on the second conductivity type semiconductor layer, wherein a first portion of the transmissive electrode layer is spaced apart from a first outer edge of the insulating layer on the second conductivity type semiconductor layer, wherein the insulating layer includes a first portion and a first extension portion, wherein the first portion of the insulating layer contacts the first electrode, wherein the extension portion of the insulating layer extends from the first portion of the insulating layer to a first location outside of an outer edge of the first electrode, wherein the first electrode includes a first portion and a second portion, wherein the first portion of the first electrode contacts the first conductivity type semiconductor layer and has an area of 10% to 95% of a top surface of the first electrode, and wherein the second portion of the first electrode is disposed on the insulating layer.

2. The light emitting device of claim 1, wherein at least one portion of the second conductivity type semiconductor layer is exposed between the transmissive electrode layer and the first outer edge of the insulating layer on the second conductivity type semiconductor layer.

3. The light emitting device of claim 1, wherein the insulating layer comprises at least one of $SiO_2$, $SiO_x$, $SiO_xN_y$, $Si_3N_4$, $TiO_2$, or $Al_2O_3$, and wherein the insulating layer comprises a roughness structure on a top surface or a bottom surface thereof.

4. The light emitting device of claim 1, wherein the first extension portion of the insulating layer extends from the a top surface of the first conductivity type semiconductor layer to a portion of a top surface of the second conductivity type semiconductor layer along a lateral surface of the light emitting structure.

5. The light emitting device of claim 1, wherein the second electrode is disposed on the transmissive electrode layer and the second conductivity type semiconductor layer.

6. The light emitting device of claim 1, wherein the transmissive electrode layer has a single layer structure or a multiple layer structure.

7. The light emitting device of claim 1, wherein the first electrode has a multiple layer structure including Al, Cr, Ni, or Au and a uppermost layer of the first electrode has Au.

8. The light emitting device of claim 1, wherein the second electrode overlaps with the transmissive electrode layer in a vertical direction.

9. The light emitting device claim 1, wherein the transmissive electrode layer is disposed on a region of the second conductivity type semiconductor, and wherein the region of the second conductivity type semiconductor excludes the insulating layer.

10. The light emitting device of claim 1, wherein the second electrode has a single layer structure or a multiple layer structure including at least one of Au, Al, Ag, Ti, Cu, Ni or Cr.

11. The light emitting device of claim 1, wherein a second portion of transmissive electrode layer is disposed under the second electrode.

12. The light emitting device of claim 1, wherein the transmissive electrode layer comprises a single layer structure or a multiple layer structure including at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, or $RuO_x$.

13. The light emitting device of claim 1, wherein a portion of the light emitting structure comprises a first rounded side surface.

14. The lighting device of claim 13, wherein the insulating layer covers the first rounded side surface.

15. A light emitting device comprising:
a light emitting structure including a first conductivity type semiconductor layer, an active layer on the first conductivity type semiconductor layer, and a second conductivity type semiconductor layer on the active layer;
a transmissive electrode layer including a metal oxide layer on the second conductivity type semiconductor layer;
an insulating layer on the first conductivity type semiconductor layer;
a first electrode on the first conductivity type semiconductor; and
a second electrode on the second conductivity type semiconductor layer, wherein a first portion of the transmissive electrode layer is spaced apart from one end of the insulating layer, wherein the first electrode includes a first portion and a second portion, wherein the first portion of the first electrode contacts the first conductivity type semiconductor layer and the second portion of the first electrode extends from the first portion of the first electrode to a first top surface of the insulating layer, wherein the insulating layer includes a first extension portion that extends from the first top surface of the insulating layer to a first location outside outer edge of the first electrode, and wherein the first portion of the first electrode has an area of 10% to 95% of a top surface of the first electrode.

16. The light emitting device of claim 15, wherein the insulating layer comprises at least one of $SiO_2$, $SiO_x$, $SiO_xN_y$, $Si_3N_4$, $TiO_2$, or $Al_2O_3$, and wherein the insulating layer comprises a roughness structure on a top surface or a bottom surface thereof.

17. The light emitting device of claim 15, wherein a portion of the light emitting structure comprises a first rounded side surface.

18. The light emitting device of claim 15, wherein the transmissive electrode layer comprises a single layer structure or a multiple layer structure including at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, and RuOx.

19. The light emitting device claim 15, wherein the transmissive electrode layer is disposed on a region of the second conductivity type semiconductor, and wherein the region of the second conductivity type semiconductor excludes the insulating layer.

20. The light emitting device of claim 15, wherein a second portion of transmissive electrode layer is disposed under the second electrode.

* * * * *